US009910122B2

(12) United States Patent
Schutzmann et al.

(10) Patent No.: US 9,910,122 B2
(45) Date of Patent: Mar. 6, 2018

(54) CALIBRATION OF A MAGNETIC SENSOR

(71) Applicant: GIESECKE & DEVRIENT GMBH, Munich (DE)

(72) Inventors: Jurgen Schutzmann, Pfaffenhofen (DE); Dieter Stein, Holzkirchen (DE); Helmut Pradel, Munich (DE); David Sacquard, Munich (DE)

(73) Assignee: GIESECKE+DEVRIENT CURRENCY TECHNOLOGY GMBH, Munich (DE)

( * ) Notice: Subject to any disclaimer, the term of this patent is extended or adjusted under 35 U.S.C. 154(b) by 271 days.

(21) Appl. No.: 14/412,765

(22) PCT Filed: Jul. 4, 2013

(86) PCT No.: PCT/EP2013/001968
§ 371 (c)(1),
(2) Date: Jan. 5, 2015

(87) PCT Pub. No.: WO2014/005714
PCT Pub. Date: Jan. 9, 2014

(65) Prior Publication Data
US 2015/0160326 A1 Jun. 11, 2015

(30) Foreign Application Priority Data
Jul. 6, 2012 (DE) .................. 10 2012 013 516

(51) Int. Cl.
*G01R 35/00* (2006.01)
*G07D 7/04* (2016.01)
*G07D 7/20* (2016.01)

(52) U.S. Cl.
CPC ............. *G01R 35/005* (2013.01); *G07D 7/04* (2013.01); *G07D 7/2008* (2013.01)

(58) Field of Classification Search
CPC ....... G01R 35/005; G07D 7/2008; G07D 7/04
(Continued)

(56) References Cited

U.S. PATENT DOCUMENTS 4,314,281 A * 2/1982 Wiggins ................. H04N 1/401
348/615
5,130,525 A * 7/1992 Ryon ................... H04N 1/0473
250/208.1
(Continued)

FOREIGN PATENT DOCUMENTS

DE 10151854 A1 5/2003
DE 19625224 B4 7/2005
(Continued)

OTHER PUBLICATIONS

German Search Report for corresponding German Application No. 102012013516.5, dated Mar. 4, 2013.
(Continued)

*Primary Examiner* — Giovanni Astacio-Oquendo
(74) *Attorney, Agent, or Firm* — Workman Nydegger

(57) ABSTRACT

The invention relates to a magnetic sensor which is designed for checking value documents, and to a method for calibrating the magnetic sensor. The magnetic sensor has different calibrating parameters for hard-magnetic and soft-magnetic magnetic regions, with which parameters the magnetic sensor can correct the detected magnetic signals of a value document, in order to compensate the magnetic sensor's measurement deviations in dependence on the type of the respectively detected magnetic region. For calibration, the magnetic sensor detects calibration measurement values of a calibration medium which is transported past the sensor. By means of the calibration measurement values the function of the magnetic sensor is tested. Where applicable, there is effected after the calibration an adjustment of the sensor using the calibration measurement values, upon which
(Continued)

adjustment the calibrating parameters for hard-magnetic and/or soft-magnetic magnetic regions are determined from the detected calibration measurement values of the calibration medium.

15 Claims, 4 Drawing Sheets

(58) Field of Classification Search
USPC .................. 324/202, 200, 207.14; 73/1.79; 250/252.1, 559.1; 376/71
See application file for complete search history.

(56) References Cited

U.S. PATENT DOCUMENTS

| | | | |
|---|---|---|---|
| 5,761,089 A | 6/1998 | McInerny | |
| 5,923,413 A * | 7/1999 | Laskowski | G07D 7/12 356/434 |
| 6,229,306 B1 | 5/2001 | Stein et al. | |
| 6,241,069 B1 | 6/2001 | Mazur et al. | |
| 8,695,397 B2 | 4/2014 | Sacquard et al. | |
| 2011/0148408 A1 | 6/2011 | Meisenberg et al. | |
| 2011/0174051 A1 | 7/2011 | Sacquard et al. | |
| 2015/0317268 A1* | 11/2015 | Rohrl | G07D 7/00 710/106 |
| 2016/0042265 A1* | 2/2016 | Rahm | G07D 7/04 235/449 |
| 2016/0148456 A1* | 5/2016 | Hecht | G07D 7/00 271/3.15 |

FOREIGN PATENT DOCUMENTS

| | | |
|---|---|---|
| DE | 102008048043 A1 | 3/2010 |
| DE | 102010019463 A1 | 11/2011 |
| WO | 2010031576 A1 | 3/2010 |

OTHER PUBLICATIONS

International Preliminary Report on Patentability for corresponding International PCT Application No. PCT/EP2013/001968, dated Jan. 6, 2015.

International Search Report for corresponding International PCT Application No. PCT/EP2013/001968, dated Oct. 22, 2013.

\* cited by examiner

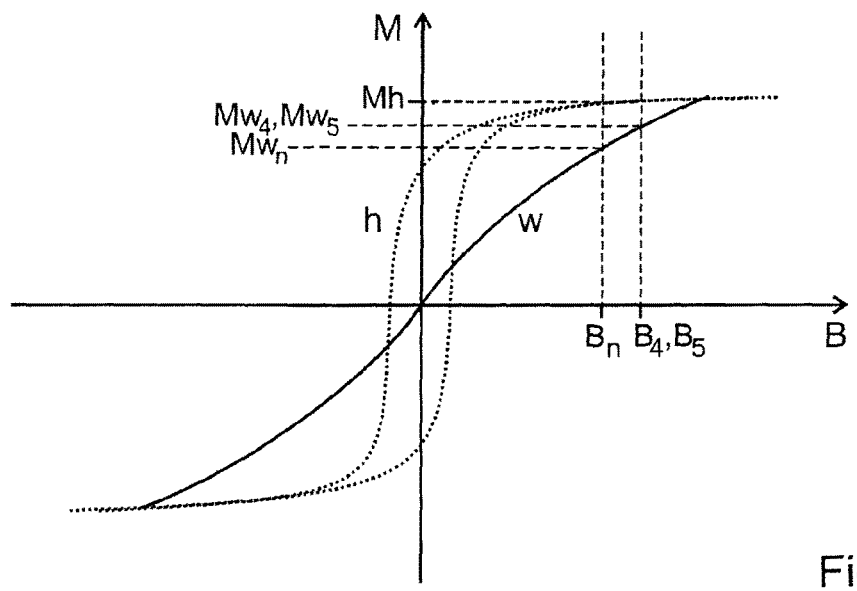
Fig. 2a
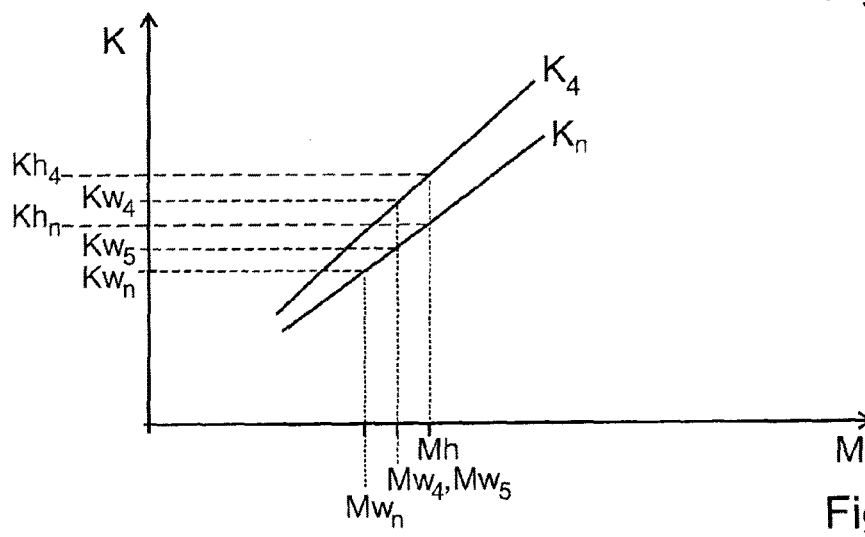
Fig. 2b
| L | $Kw_1$ ... $Kw_{10}$ | $Vw_1$ ... $Vw_{10}$ | $Kh_1$ ... $Kh_{10}$ | $Vh_1$ ... $Vh_{10}$ |
|---|---|---|---|---|
| 1 | 1,6 | 1,25 | 2 | 1,5 |
| 2 | 1,6 | 1,25 | 2 | 1,5 |
| 3 | 1,6 | 1,25 | 2 | 1,5 |
| 4 | 2,25 | 0,89 | 2,5 | 1,2 |
| 5 | 1,8 | 1,11 | 2 | 1,5 |
| 6 | 1,6 | 1,25 | 2 | 1,5 |
| 7 | 1,6 | 1,25 | 2 | 1,5 |
| 8 | 1,6 | 1,25 | 2 | 1,5 |
| 9 | 1,6 | 1,25 | 2 | 1,5 |
| 10 | 1,6 | 1,25 | 2 | 1,5 |
Fig. 2c

| L | S(x1) | Vw | RW(x1) = S(x1)·Vw |
|---|---|---|---|
| 1 | 0,15 | 1,25 | 0,19 |
| 2 | 2 | 1,25 | 2,50 |
| 3 | 2,05 | 1,25 | 2,56 |
| 4 | 2,9 | 0,89 | 2,58 |
| 5 | 2,3 | 1,11 | 2,55 |
| 6 | 0,2 | 1,25 | 0,25 |
| 7 | 0,15 | 1,25 | 0,19 |
| 8 | 0,18 | 1,25 | 0,23 |
| 9 | 0,16 | 1,25 | 0,20 |
| 10 | 0,16 | 1,25 | 0,20 |

| L | S(x2) | Vh | RH(x2) = S(x2)·Vh |
|---|---|---|---|
| 1 | 2 | 1,5 | 3 |
| 2 | 2,1 | 1,5 | 3,15 |
| 3 | 2,1 | 1,5 | 3,15 |
| 4 | 2,5 | 1,2 | 3 |
| 5 | 2 | 1,5 | 3 |
| 6 | 2 | 1,5 | 3 |
| 7 | 2 | 1,5 | 3 |
| 8 | 2,1 | 1,5 | 3,15 |
| 9 | 2,1 | 1,5 | 3,15 |
| 10 | 2 | 1,5 | 3 |

CALIBRATION OF A MAGNETIC SENSOR

BACKGROUND

This invention relates to a method for calibrating a magnetic sensor which is designed for checking value documents. The invention also relates to a magnetic sensor that is calibratable by the method according to the invention, and to a value-document processing apparatus having such a magnetic sensor.

For checking value documents there are usually employed sensors for determining the type of the value documents and/or for checking the value documents for authenticity and/or their state. Such sensors are employed e.g. for checking bank notes, checks, identity cards, tickets, vouchers and the like. The value documents are checked in an apparatus for value-document processing which contains one or more different sensors, depending on the value-document properties to be checked.

For example, the value documents are checked using magnetic sensors. Usually, the magnetic sensors are tested for their functionality at certain time intervals or as the need arises, as known e.g. from WO 2010/031576 A1. For testing a magnetic sensor, the latter is first calibrated and subsequently adjusted, if necessary. Calibration is usually effected using calibration media which are fed to the sensor and from which the magnetic sensor senses calibration measurement values. The calibration media can be designed for testing one or more properties of an individual sensor, or for testing a plurality of or all the relevant properties of a plurality of or all the relevant sensors of the apparatus for value-document processing. For example, for calibrating magnetic sensors, paper sheets with known, predefined properties are used as calibration media.

For the value-document check, the value documents to be checked are transported past the magnetic sensor while the latter detects magnetic signals of the respective value document. To calibrate the magnetic sensor, a calibration medium is transported past the magnetic sensor, instead of the value documents, with the magnetic sensor detecting calibration measurement values of the calibration medium. The calibration measurement values are compared with target values which are associated with the calibration medium. If the calibration measurement values of the calibration medium deviate from the target values of the calibration medium, an adjustment of the relevant magnetic sensor is carried out, where applicable, upon which adjustment the sensor is, if possible, so set that it delivers at least approximately the target values when detecting the calibration medium. The thus adjusted sensor is subsequently employed for checking value documents. It is disadvantageous in the hitherto used method that a value document's magnetic signal detected by a magnetic sensor can nevertheless exhibit measurement deviations after calibration of the magnetic sensor, in spite of the subsequent adjustment of the magnetic sensor.

SUMMARY

An object of the present invention is to eliminate measurement deviations of a magnetic sensor which remain in spite of the calibration and adjustment of the magnetic sensor.

The invention is based on the finding that—in spite of the calibration and adjustment of the magnetic sensor—there remain measurement deviations which come about through the magnetic sensor itself. It has been found that the errors are based e.g. on fluctuations upon the mechanical mounting of magnetosensitive elements of the magnetic sensor or of magnets of the magnetic sensor which are employed for magnetizing the value documents. It has moreover been recognized that the calibration and adjustment cause only certain errors to be corrected, such as e.g. installation fluctuations of the magnetosensitive elements of the magnetic sensor, while other errors are not taken into consideration, and that these other errors can still falsify the detected magnetic signal.

Studies have shown that some errors of the magnetic sensor affect the detected magnetic signal differently depending on which magnetic material the magnetic sensor is detecting. With magnetic material whose magnetization is strongly dependent on the applied magnetic field, such as e.g. with soft-magnetic magnetic material, a fluctuation of the applied magnetic field has a clear effect on the detected magnetic signal. With another magnetic material whose magnetization is hardly dependent on the applied magnetic field, such as e.g. with hard-magnetic magnetic material, in contrast, a fluctuation of the applied magnetic field has hardly any effect on the detected magnetic signal. With hitherto used magnetic sensors which employ only one type of calibrating parameters, this leads to measurement deviations. For when such a magnetic sensor is calibrated using a calibration medium with hard-magnetic magnetic material whose magnetization is tolerant to fluctuations of the applied magnetic field, then errors relating to the magnetic field applied for magnetizing the value document are not taken into consideration upon the subsequent adjustment of the magnetic sensor. Upon a subsequent detection of soft-magnetic magnetic material, however, these errors falsify the detected magnetic signals. When such a magnetic sensor is adjusted to the calibration measurement values of a soft-magnetic magnetic material, on the other hand, the magnetic signals of a value document are later corrected to a resultant magnetic signal in which the magnetic-field fluctuations have been taken into consideration. Upon the detection of hard-magnetic magnetic material of a value document, however, the same later correction of the detected magnetic signal would be superfluous and even falsify the resultant magnetic signal.

In contrast to hitherto used magnetic sensors which employ only one type of calibrating parameters, there are provided in the magnetic sensor according to the invention different calibrating parameters for magnetic regions made of different magnetic material. The magnetic sensor has at least one first calibrating parameter and at least one second calibrating parameter independent of the first calibrating parameter/s and is electively configurable with the first or with the second calibrating parameter/s. The first calibrating parameter is provided for correcting a magnetic signal of the magnetic sensor which the magnetic sensor, when checking a value document, detects from a soft-magnetic magnetic region of the value document to be checked, in order to compensate the magnetic sensor's measurement deviations exhibited by the magnetic signals that the magnetic sensor detects from the value document's soft-magnetic magnetic region. The second calibrating parameter is provided for correcting a magnetic signal of the magnetic sensor which the magnetic sensor, when checking a value document, detects from a hard-magnetic magnetic region of a value document to be checked, in order to compensate the magnetic sensor's measurement deviations exhibited by the magnetic signals that the magnetic sensor detects from the value document's hard-magnetic magnetic region. Additionally, the magnetic sensor can also have further calibrating parameters for other types of magnetic regions of the value document.

The magnetic sensor according to the invention is arranged for correcting one and the same magnetic signal of the magnetic sensor which the latter detects from a value document to be checked either with the first calibrating parameter/s or with the second calibrating parameter/s. Thus, the magnetic sensor can be configured for detecting different magnetic materials and employ, according to requirements, the right calibrating parameters for the magnetic material to be detected. It is thus possible to compensate the above-mentioned errors of the magnetic sensor without having to make any changes on the permanent magnets of the magnetic sensor, for example. The first and second calibrating parameters thus enable measurement value deviations that the respective magnetic sensor has to be compensated individually for the respective magnetic sensor.

The magnetic sensor is designed for checking value documents which are transported for their check past the magnetic sensor along a transport direction. For calibration of the magnetic sensor, a calibration medium can be transported past the sensor along the transport direction. Upon calibration of the magnetic sensor and upon checking of the value documents, magnetic signals of the calibration medium being transported past or of the value document are respectively detected. For calibration of the magnetic sensor and for checking of the value documents there are provided different operating modes of the magnetic sensor, which can be set from outside and in which the sensed magnetic signals are employed differently. In the calibrating mode of the magnetic sensor, the magnetic sensor is calibrated, with the function of the magnetic sensor being tested using the magnetic signals detected from the calibration medium, and being adjusted after calibration, where applicable. The magnetic sensor can for this purpose be equipped with or connected to a calibrating device which has calibrating software in order to carry out the calibration and, where applicable, adjustment of the magnetic sensor. In the checking mode of the magnetic sensor, the magnetic signals of a value document are detected and employed for determining the authenticity and/or type and/or state of the value document.

The magnetic sensor is designed both for detecting magnetic signals of hard-magnetic magnetic regions and for detecting magnetic signals of soft-magnetic magnetic regions. For this purpose, the value document or the calibration medium is subjected, during detection by the magnetic sensor, to a magnetic field which is made available by a magnet. The magnet can be part of the magnetic sensor itself or be a magnet present outside the magnetic sensor.

In an exemplary embodiment, the magnetic sensor has a plurality of measuring tracks through which the magnetic sensor can detect a magnetic signal at a plurality of positions of the value document. The magnetic sensor has per measuring track both a first calibrating parameter and a second calibrating parameter which is independent of the first calibrating parameter of the respective measuring track. For example, a first and a second calibration measurement value is respectively detected individually for each of the measuring tracks upon calibration, and there is determined on the basis of the first/second calibration measurement value detected for the respective measuring track a first/second calibrating parameter through which the respective measuring track is configurable.

In particular, the magnetic sensor is arranged for correcting the detected magnetic signal in dependence on the position on the value document at which the magnetic sensor detects the magnetic signal. For example, different calibrating parameters are employed at different positions of the value document. Alternatively or additionally, the magnetic sensor can also correct the detected magnetic signal in dependence on the value-document type of the value document to be checked, electively with the first or with the second calibrating parameter. For example, the magnetic sensor can itself determine the value-document type or have the information about the value-document type fed thereto from outside.

For example, the magnetic sensor is connected to a data memory, or has a data memory, in which the at least one first calibrating parameter and the at least one second calibrating parameter of the magnetic sensor are deposited. The data memory can be disposed inside or outside the magnetic sensor. In the data memory there are deposited different calibrating parameters in dependence on the value-document type and/or in dependence on the position on the respective value document. The data memory stores information which determines which of the magnetic signals that the magnetic sensor detects from a value document are to be corrected with the first calibrating parameter and which with the second calibrating parameter. This information is present in the data memory in particular in dependence on the value-document type, in the case of bank notes e.g. in dependence on the currency or the denomination or the emission of the bank note.

In one exemplary embodiment, the magnetic sensor has an evaluation device which has evaluation software for processing and evaluating the detected magnetic signals of the magnetic sensor. The evaluation software is designed for correcting, in the checking mode of the magnetic sensor, in dependence on whether the magnetic signal is detected from a soft-magnetic magnetic region of a value document or from a hard-magnetic magnetic region of a value document, the respective magnetic signal either on the basis of the first or on the basis of the second calibrating parameter. In dependence on whether the magnetic signal is detected from a soft-magnetic magnetic region or from a hard-magnetic magnetic region, the evaluation software can read out the first or the second calibrating parameter from the data memory and employ it for correcting the detected magnetic signal. The evaluation device is disposed inside or outside the magnetic sensor. The data memory employed for the calibrating parameters can be part of the evaluation device of the magnetic sensor or be connected to said evaluation device.

The evaluation software is designed for computing, upon the check of a value document, the magnetic signal that the magnetic sensor detects from a soft-magnetic magnetic region of the value document to be checked with the first calibrating parameter to form a resultant magnetic signal, in order to compensate the magnetic sensor's measurement deviations exhibited by the magnetic signals that the magnetic sensor detects from the value document's soft-magnetic magnetic region. And the evaluation software is designed for computing, upon the check of a value document, the magnetic signal that the magnetic sensor detects from a hard-magnetic magnetic region of the value document with the second calibrating parameter to form a resultant magnetic signal, in order to compensate the magnetic sensor's measurement deviations exhibited by the magnetic signals that the magnetic sensor detects from the value document's hard-magnetic magnetic region. The first/ second calibrating parameter is e.g. a factor which is intended to be multiplied by the detected magnetic signal that the magnetic sensor detects from a soft/hard-magnetic magnetic region of the value document.

Alternatively, the magnetic sensor can also have a configurable electronic amplifier for amplifying the detected magnetic signals. In the checking mode of the magnetic sensor, the amount of the amplification can then be set either on the basis of the first or on the basis of the second calibrating parameter in dependence on whether the magnetic signal is detected from a soft-magnetic magnetic region of a value document or from a hard-magnetic magnetic region of a value document. When the detected magnetic signal is detected from a soft-magnetic magnetic region of a value document the amplification is set on the basis of the first calibrating parameter, and when the detected magnetic signal is detected from a hard-magnetic magnetic region of a value document the amplification is set on the basis of the second calibrating parameter. With a multitrack magnetic sensor, the amount of the amplification can be set individually for each of the measuring tracks on the basis of the respective first/second calibrating parameter.

Alternatively, the magnetic sensor can have at least one configurable magnetosensitive element whose sensitivity is configurable. In the checking mode of the magnetic sensor, the sensitivity can be set either on the basis of the first or on the basis of the second calibrating parameter in dependence on whether the magnetic signal is detected from a soft-magnetic magnetic region of a value document or from a hard-magnetic magnetic region of a value document. For this purpose, one can e.g. change the measuring current through the respective magnetosensitive element of the magnetic sensor, or also an electrical voltage applied to the respective magnetosensitive element, in order to adapt the sensitivity of the respective magnetosensitive element in a targeted manner.

For calibrating the magnetic sensor, the function of the magnetic sensor is tested in a calibrating mode of the magnetic sensor. In the calibrating mode, a calibration medium having for example at least one soft-magnetic magnetic region and/or at least one hard-magnetic magnetic region is transported past the magnetic sensor along the transport direction. While the calibration medium is being transported past the magnetic sensor, the magnetic sensor detects at least one first calibration measurement value from the soft-magnetic magnetic region of the calibration medium and/or at least one second calibration measurement value from the hard-magnetic magnetic region of the calibration medium. The soft-magnetic magnetic region and the hard-magnetic magnetic region are respectively contained in/on a calibration medium which, for calibration of the magnetic sensor, is transported past the magnetic sensor along a transport direction. There can be employed a calibration medium which has both soft-magnetic and hard-magnetic magnetic regions. Alternatively, the soft-magnetic and hard-magnetic magnetic regions can, however, also be present on different calibration media which, for calibration, are transported past the magnetic sensor and detected by the magnetic sensor separately from each other.

The calibration of the magnetic sensor will be carried out e.g. within an apparatus for value-document processing in which the magnetic sensor is installed. The calibration medium is then transported past using the transport system of the apparatus which transports the value documents. However, the calibration of the magnetic sensor can also be carried out outside the apparatus for value-document processing, e.g. at a calibration station. In this case, the transporting past of the calibration medium is obtained through other transport means, e.g. through a rotatable cylindrical transport drum on which a calibration medium having soft-magnetic and/or hard-magnetic magnetic material is present. Through rotation of the transport drum around its axis, the respective magnetic material is transported periodically past the stationarily installed magnetic sensor, with the magnetic sensor detecting corresponding calibration measurement values.

After detection thereof, the detected first and/or second calibration measurement value is further processed in order to test the function of the magnetic sensor using the detected first and/or second calibration measurement value. Upon further processing of the calibration measurement values, the magnetic sensor tests the calibration measurement values e.g. for measurement deviations in comparison to target values and carries out an adjustment of the magnetic sensor, where applicable, in dependence on the result of the test. The calibration measurement values are compared with target values that are associated with the calibration medium. The target values can be brought into the magnetic sensor or into the apparatus for value-document processing via a corresponding interface. The target values can be brought in by manual input, via a network connection or via a data carrier or through identification of the calibration medium using the magnetic sensor or using another sensor of the apparatus and automatic selection of the appurtenant target values in dependence on the identity of the calibration medium. The target values can be fixed numerical values, e.g. a plurality of numerical values for different portions of the value document. The numerical values can be furnished with fluctuation ranges through which acceptable deviations from the target values are allowed.

If the calibration measurement values deviate from the target values of the calibration medium, the calibration can be followed by an adjustment of the sensor. Adjustment of the sensor can be effected automatically or be triggered manually only after a corresponding confirmation from outside, e.g. by an operating person who has initiated the calibration of the sensor and to whom the result of the calibration is communicated. If the deviation lies within the acceptance range around the target value, the adjustment of the magnetic sensor can also be omitted. However, the adjustment of the magnetic sensor can also be carried out as a precaution, independently of whether or not the detected calibration measurement values deviate from the target values.

The optional adjustment of the magnetic sensor is carried out on the basis of the detected first calibration measurement values and/or on the basis of the detected second calibration measurement values. Upon the adjustment of the magnetic sensor, the first calibrating parameter is established using the detected first calibration measurement value, and/or the second calibrating parameter using the detected second calibration measurement value, thereby changing the configuration of the magnetic sensor with the first and/or with the second calibrating parameter. In this way the calibrating parameters are adapted which the magnetic sensor employs for processing magnetic signals of the value documents. For adjustment of the magnetic sensor, new calibrating parameters determined through the calibration can be stored in the data memory. For adjustment, the amount of the amplification of the magnetic-signal amplifier can, however, also be adapted in dependence on the calibrating parameter, or the sensitivity of the magnetosensitive element of the magnetic sensor be adapted in dependence on the calibrating parameter. Optionally, a hardware adjustment of the magnetic sensor can also be carried out, e.g. in the case of very great deviations of the calibration measurement values from the target values.

For testing the function of the magnetic sensor, the difference between the detected first/second calibration measurement values and the first/second target values is e.g. established and it is tested whether the detected first/second calibration measurement values lie within an acceptance range around the first/second target value. The adjustment of the magnetic sensor is carried out only if the detected first/second calibration measurement value lies outside an acceptance range around the first/second target value.

To calibrate the magnetic sensor for a check of soft-magnetic magnetic regions, first calibration measurement values of a calibration medium (e.g. of a soft-magnetic magnetic region of the calibration medium) are detected and it is tested whether these first calibration measurement values correspond to first target values that are specified for the calibration medium. In dependence on the result of the test of the detected first calibration measurement values, an adjustment of the magnetic sensor is carried out on the basis of the first calibration measurement values, upon which adjustment the respective first calibrating parameter is adapted using the first calibration measurement values detected by the magnetic sensor.

To calibrate the magnetic sensor for a check of hard-magnetic magnetic regions, second calibration measurement values of a calibration medium (e.g. of a hard-magnetic magnetic region of the calibration medium) are detected and it is tested whether these second calibration measurement values correspond to second target values that are specified for the calibration medium. In dependence on the result of the test of the detected second calibration measurement values, an adjustment of the magnetic sensor is carried out on the basis of the second calibration measurement values, upon which adjustment the respective second calibrating parameter is adapted using the second calibration measurement values detected by the magnetic sensor.

When testing whether the first/second calibration measurement values of the soft-magnetic/hard-magnetic magnetic region that are detected by the magnetic sensor correspond to the first/second target values, it is tested e.g. whether they lie within a first/second acceptance range around the respective target value which is specified for the soft-magnetic/hard-magnetic magnetic region of the calibration medium, and which includes the respective target value. If the test yields that the detected calibration measurement values of the soft-magnetic/hard-magnetic magnetic region correspond to the first/second target values, the first/second calibrating parameter remains at its initial value unchanged. If the test yields that the detected first/second calibration measurement values of the soft-magnetic/hard-magnetic magnetic region do not correspond to the first/second target values, the first/second calibrating parameter is newly established on the basis of the detected first/second calibration measurement value. The newly established first/second calibrating parameter is intended to be computed with the magnetic signals detected from a soft-magnetic/hard-magnetic magnetic region of a value document to be checked, in order to compensate measurement deviations exhibited by the magnetic signals that are detected from the soft-magnetic/hard-magnetic magnetic region of the value document.

After testing of the function of the magnetic sensor and after an adjustment of the magnetic sensor, where applicable, the magnetic sensor is employed for checking a value document having at least one soft-magnetic magnetic region and/or at least one hard-magnetic magnetic region. For checking the value document, the value document is transported past the magnetic sensor along the transport direction, with the magnetic sensor detecting magnetic signals from the soft-magnetic magnetic region of the value document, and/or with the magnetic sensor detecting magnetic signals from the hard-magnetic magnetic region of the value document. The magnetic signals detected from the soft-magnetic magnetic region are corrected using the first calibrating parameter, in order to compensate the magnetic sensor's measurement deviations exhibited by the magnetic signals that the magnetic sensor detects from the soft-magnetic magnetic region of the value document. Alternatively or additionally, the magnetic signals detected from the hard-magnetic magnetic region are corrected using the second calibrating parameter, in order to compensate the magnetic sensor's measurement deviations exhibited by the magnetic signals that the magnetic sensor detects from the hard-magnetic magnetic region of the value document. The corrected magnetic signal of the soft-magnetic magnetic region and/or of the hard-magnetic magnetic region is employed for checking magnetic properties of the value document.

The invention also relates to an apparatus for processing value documents that has a magnetic sensor according to the invention. The value documents are checked by the magnetic sensor e.g. in an apparatus for value-document processing which has a transport system for transporting the value documents past the sensor along a transport direction. The apparatus can have an evaluation device for evaluating the detected magnetic signals and for calibrating the magnetic sensor, where applicable. The apparatus for value-document processing can also be equipped with a calibrating device which is designed for calibrating the magnetic sensor by the method according to the invention and adjusting it, where applicable. The apparatus has e.g. a calibrating mode in which one or a plurality of sensors of the apparatus can be calibrated. The apparatus can moreover be equipped with input and output pockets for feeding the value documents to the apparatus or removing them therefrom.

For calibrating the magnetic sensor there is preferably employed a set of calibration media, e.g. a package of calibration media, which are detected by the magnetic sensor singly one after the other. Through the calibration with a multiplicity of calibration media, the accuracy of the calibration can be increased. For calibration, the individual calibration media of the set are successively transported through the apparatus and past the magnetic sensor to be calibrated. The calibration media of the set differ for example only in their identifier, while their magnetic regions are the same. For each individual calibration medium of the set, calibration measurement values are determined. From the individual first/second calibration measurement values of the calibration media of the set, a first/second average is e.g. formed and it is tested whether the first/second average corresponds to a first/second target value that is expected for the set of calibration media. Optionally, there follows an adjustment of the magnetic sensor, as described above, if the first average and/or second average does not correspond to the respective target value.

BRIEF DESCRIPTION OF THE DRAWINGS

Hereinafter, the invention will be explained by way of example with reference to the following figures.

There are shown.

DETAILED DESCRIPTION OF VARIOUS EMBODIMENTS

Figure 1A:
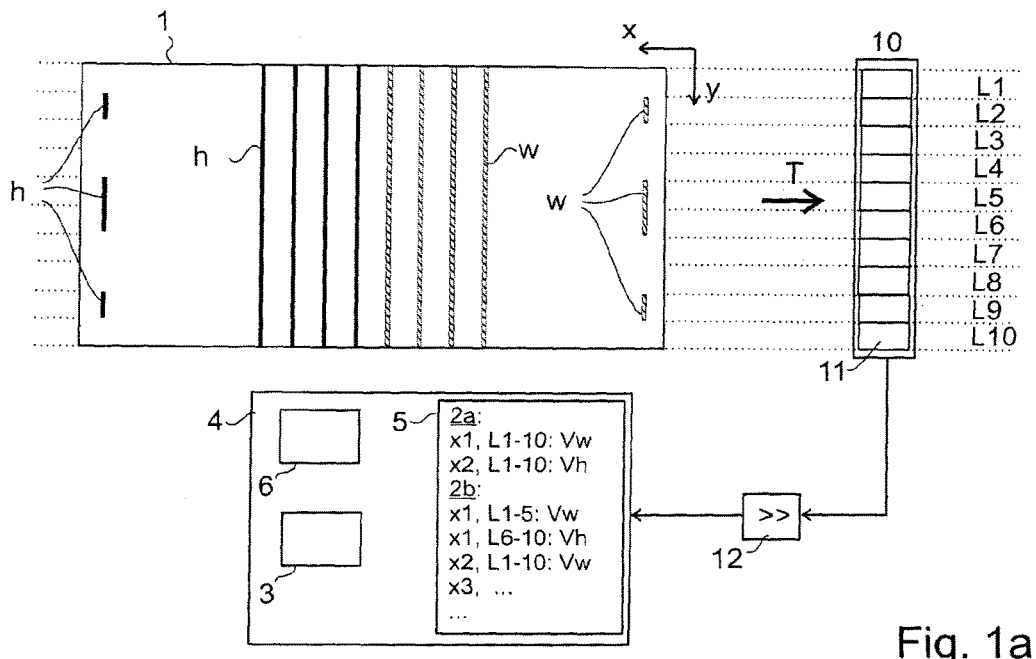
FIG. 1a a calibration medium which, for calibrating a magnetic sensor, is transported past the magnetic sensor, FIG. 1b a value document which is being transported, for its check, past the magnetic sensor, FIGS. 2a-c magnetization curves (FIG. 2a) and calibration measurement values (FIG. 2b) for different magnetic materials which show the magnetic sensor's measurement deviations, and calibrating parameters established therefrom (FIG. 2c), FIGS. 3a-b magnetic signal of a soft-magnetic magnetic region of the value document and its correction using the appurtenant calibrating parameters, FIGS. 3c-d magnetic signal of a hard-magnetic magnetic region of the value document and its correction using the appurtenant calibrating parameters.
Figure 1B:
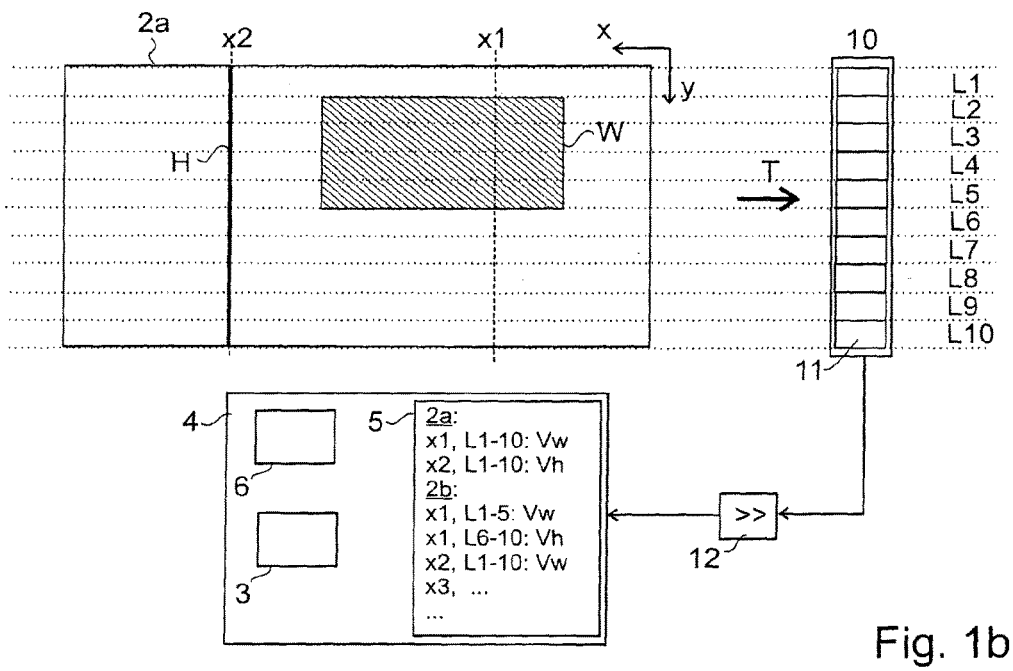

FIGS. 1a and 1b show a magnetic sensor 10 having ten measuring tracks L1-L10 which are disposed perpendicular to the transport direction T of the calibration medium 1. For each measuring track L1-L10 there is respectively provided a magnetosensitive element 11 which detects magnetic signals of a calibration medium 1 transported past the magnetic sensor 10, cf. FIG. 1a, or of a value document 2a transported past, cf. FIG. 1b. To enable both hard-magnetic and soft-magnetic magnetic regions to be detected, the magnetic sensor has e.g. permanent magnets (not shown) which magnetize the magnetic material of the calibration medium 1 to be detected or of the value document 2a, so that it is located in an external magnetic field during detection of the magnetic signals. The magnetosensitive elements 11 are e.g. inductive or magnetoresistive elements (e.g. GMR elements, AMR elements or conventional magnetoresistive elements) or Hall elements. At a time prior to the calibration of the magnetic sensor 10, the respective calibrating parameters Vw, Vh were fixed to a certain initial value for each measuring track L1-L10, e.g. upon an earlier calibration or upon the manufacture of the magnetic sensor.

The magnetic signal detected by the magnetosensitive elements 11 is amplified by an amplifier 12. Optionally, each measuring track has a dedicated amplifier associated therewith. The amplified magnetic signals of the measuring tracks L1-L10 are passed to an evaluation device 4 which evaluates the magnetic signals detected from a value document 2a using evaluation software 6 which the evaluation device 4 executes in the checking mode of the magnetic sensor. Apart from the checking mode, the magnetic sensor also has a calibrating mode in which a calibration and, where applicable, adjustment of the magnetic sensor 10 can be carried out using the calibration measurement values detected from the calibration medium. For this purpose there is employed calibrating and adjustment software 3 which is likewise executed by the evaluation device 4. The amplifier 12 and the evaluation device 4 can be disposed in a housing of the magnetic sensor 10 or outside, e.g. in the apparatus for value-document processing. The arrangement shown in FIGS. 1a and 1b can be part of an apparatus for value-document processing in which value documents are checked using the magnetic sensor 10. Alternatively, there can also be employed an external calibrating device which is attached, for calibration, to the magnetic sensor or to the apparatus.

The calibration medium 1 shown in FIG. 1a is employed for calibrating the magnetic sensor 10 and is transported for this purpose past the magnetic sensor 10 along a transport direction T. In so doing, the magnetic sensor 10 detects magnetic signals of the calibration medium 1, which signals will hereinafter be designated calibration measurement values. The calibration medium 1 has, in the present exemplary embodiment, four line-shaped magnetic regions h made of hard-magnetic magnetic material and four line-shaped magnetic regions w made of soft-magnetic magnetic material. Ideally, if it is optimally adjusted, the magnetic sensor 10 detects certain target values from these magnetic regions h, w. In this exemplary embodiment, three markings made of soft-magnetic magnetic material are additionally provided at the beginning of the calibration medium 1, and three markings made of hard-magnetic magnetic material at the end of the calibration medium 1, said markings being respectively disposed along a line perpendicular to the transport direction T. The markings deliver magnetic signals that can be used to capture the transport position of the calibration medium 1 as well upon calibration of the magnetic sensor 10. If the transport position is not ideal, e.g. the calibration medium 1 is skewed, or the transport speed deviates, the detected calibration measurement values can then be corrected accordingly.

FIG. 1b represents a value document 2a which is being transported, for its check, past the magnetic sensor 10 along a transport direction T. In so doing, the magnetic sensor 10 detects magnetic signals of the value document 2a. Each measuring track L1-L10 detects, in temporal succession, magnetic signals of the value-document portion respectively located in its capture region, in order to carry out a spatially resolved detection in the x and y directions. The value document is thereby scanned quasi two-dimensionally in order to check its magnetic properties. The value document 2a has by way of example both a soft-magnetic magnetic region W and a hard-magnetic magnetic region H, these involving the same or a different (but preferably similar) hard-magnetic/soft-magnetic magnetic material as in the calibration medium 1.

FIG. 2a illustrates the magnetization M as a function of the magnetic field B for hard-magnetic and soft-magnetic magnetic material. The magnetization curve h has the hysteretic form typical of hard-magnetic magnetic material. By way of example it is assumed that in the measuring tracks L4 and L5 a greater magnetic field strength $B_4$, $B_5$ is present than in the other measuring tracks of the magnetic sensor ($B_n$), e.g. due to position fluctuations of the magnetic sensor's permanent magnets. Since the magnetization M of the hard-magnetic magnetic material h is insensitive to fluctuations of the magnetic field strength B at a magnetic field with the strength $B_n$, due to the hysteretic form, the magnetic field fluctuation hardly affects the magnetization M of the hard-magnetic magnetic material h. The hard-magnetic magnetic material h receives nearly the same magnetization Mh on all measuring tracks L1-L10. The magnetization curve w of the soft-magnetic magnetic material, however, has a clear magnetic field dependence at $B_n$. The soft-magnetic magnetic material hence receives a greater magnetization $Mw_4$, $Mw_5$ in the measuring tracks L4 and L5 than in the other measuring tracks, in which the soft-magnetic magnetic material w reaches the magnetization $Mw_n$.

The different magnetization M of the magnetic regions h, w of the calibration medium 1 affects the detected calibration measurement values K, cf. FIG. 2b. Furthermore, the sensitivity of the magnetosensitive elements 11 of the measuring tracks L1-L10 of the magnetic sensor 10 can e.g. also vary, however. By way of example it is assumed that the magnetosensitive element 11 of the measuring track L4 delivers a greater magnetic signal—even at an equally great magnetization M of the respective magnetic region—than the other measuring tracks L1-L3 and L5-L10, cf. the functions $K_4$ and $K_n$ represented in FIG. 2b. The magnetization Mh of the hard-magnetic magnetic region h of the calibration medium 1 hence leads to a greater calibration measurement value $Kh_4$ in measuring track L4 than in the other measuring tracks, on which the calibration measurement value $Kh_n$ is detected. The magnetization $Mw_4$ and $Mw_5$ of the soft-magnetic magnetic region w leads to greater calibration measurement values $Kw_4$, $Kw_5$ in the measuring tracks L4 and L5 than in the other measuring tracks, on which the calibration measurement value $Kw_n$ is detected. The calibration measurement value $Kw_4$ of the measuring track L4 exceeds that of the measuring track $Kw_5$ here due to the greater sensitivity of the measuring track L4.

FIG. 2c indicates for each measuring track L1-L10, by way of example, calibration measurement values Kw of the soft-magnetic magnetic region and Kh of the hard-magnetic magnetic region of the calibration medium 1 which are detected upon calibration of the magnetic sensor 10. The respective calibration measurement value Kw, Kh can result e.g. from the average of a plurality of calibration measurement values of the calibration medium 1. An average combines e.g. the calibration measurement values obtained from the four line-shaped magnetic regions h, w, or also calibration measurement values that are obtained from a plurality of calibration media of the same kind which are transported past the magnetic sensor and detected successively. The calibration medium 1 has associated therewith target values for the calibration measurement value Kw and for the calibration measurement value Kh. For example, the target value Kw0=1.6 has been specified for the calibration measurement value Kw for all measuring tracks L1-L10, and the target value Kh0=2.0 for the calibration measurement value Kh for all measuring tracks L1-L10. Upon calibration there is detected in the measuring tracks L1-L3 and L6-L10 a calibration measurement value Kw, Kh that corresponds to the target value. In the measuring tracks L4 and L5, however, there are clear deviations from these target values.

After this calibration, an adjustment of the magnetic sensor is carried out, if necessary or desired. The adjustment is carried out e.g. when the detected calibration measurement values have too great a deviation from the target values Kw0, Kh0. When the acceptable deviation for the detected calibration measurement values Kw, Kh amounts e.g. to +−10% around the respective target value Kw0, Kh0, the first calibration measurement values Kw of the measuring tracks L4 and L5 and the second calibration measurement value Kh of the measuring track L4 lie outside the acceptance range.

For adjustment there is calculated from the respective calibration measurement value Kw a new first calibrating parameter Vw, and from the respective calibration measurement value Kh a new second calibrating parameter Vh, which replaces the previous one. Since the measuring tracks L4 and L5 deliver elevated first calibration measurement values Kw, and L4 an elevated second calibration measurement value Kh, there are obtained for these measuring tracks accordingly reduced new calibrating parameters, cf. FIG. 2c. The thus obtained new calibrating parameters are subsequently stored in the data memory 5 and replace the respective initial value there, so that they are available upon the check of the value documents. The calibrating parameters Vw, Vh established upon adjustment are subsequently employed for compensating the measurement deviations to which the detected magnetic signal of a value document is subject.

Figures 3A, 3B:
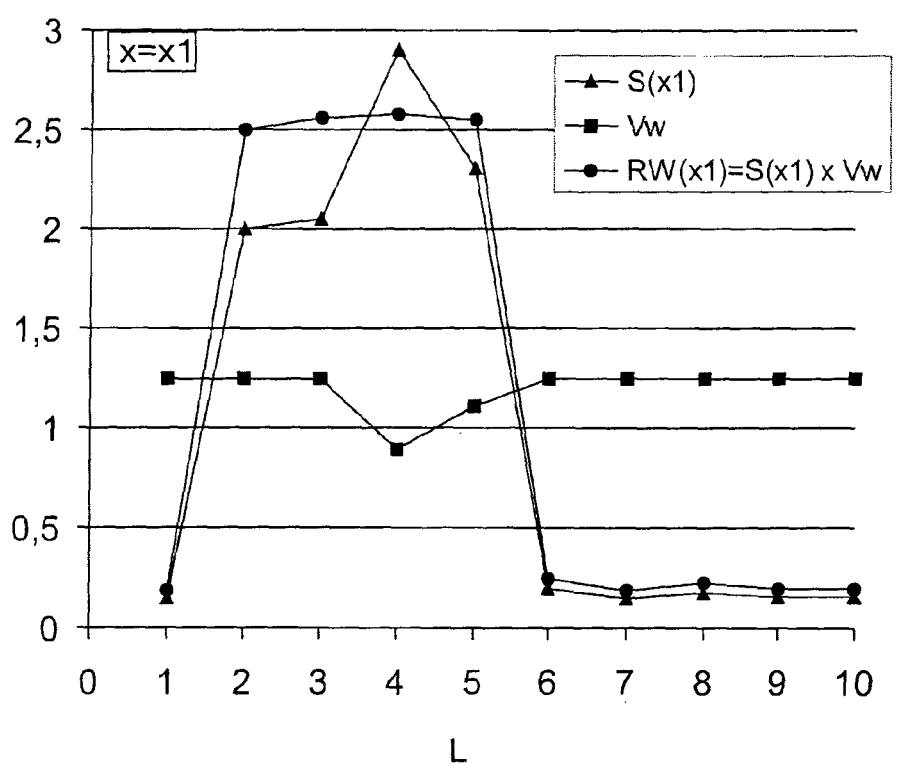

With reference to FIGS. 3a-d it will become clear how the adjustment of the magnetic sensor 10 affects the magnetic signals S of the magnetic sensor. The table of FIG. 3a shows for each measuring track L1-L10, by way of example, the magnetic signal S(x1) that the magnetic sensor 10 detects from the value document 2a at the position x1, and the table of FIG. 3b the magnetic signal S(x2) that the magnetic sensor 10 detects at the position x2.

The data memory 5 of the magnetic sensor 10 contains the information about which calibrating parameter Vw, Vh is to be employed at which coordinates x, y of the value document 2a, cf. FIG. 1b. Further, it stores for each measuring track the respective numerical values Kw, Vw, Kh, Vh (table from FIG. 2c). The value document 2a belongs to a value-document type a for which the data memory 5 stores the information stated in the following Table 1. The calibrating parameters Vw, Vh to be employed for a value document 2b of another value-document type b are stated in Table 2. At the position x1 of the value documents of the value-document type a the respective calibrating parameter Vw is to be employed with all measuring tracks L1-L10 according to Table 1, and at the position x2 the respective calibrating parameter Vh with all measuring tracks L1-L10. With value documents 2b of the value-document type b the respective calibrating parameter Vw is to be employed with the measuring tracks L1-L5 at the position x1 according to Table 2, the respective calibrating parameter Vh with the measuring tracks L6-L10, and the respective calibrating parameter Vh with all measuring tracks L1-L10 at the position x2. The calibrating parameters can of course also be present for further x positions of the value document 2a and for further value-document types.

TABLE 1

| Value-document type a: | | |
|---|---|---|
| Position x1 | Measuring tracks L1-L10 | Calibrating parameter Vw |
| Position x2 | Measuring tracks L1-L10 | Calibrating parameter Vh |

TABLE 2

| Value-document type b: | | |
|---|---|---|
| Position x1 | Measuring tracks L1-L5 | Calibrating parameter Vw |
| Position x1 | Measuring tracks L6-L10 | Calibrating parameter Vh |
| Position x2 | Measuring tracks L1-L10 | Calibrating parameter Vw |
| Position x3 | ... | ... |
| ... | ... | ... |

Figures 3C, 3D:
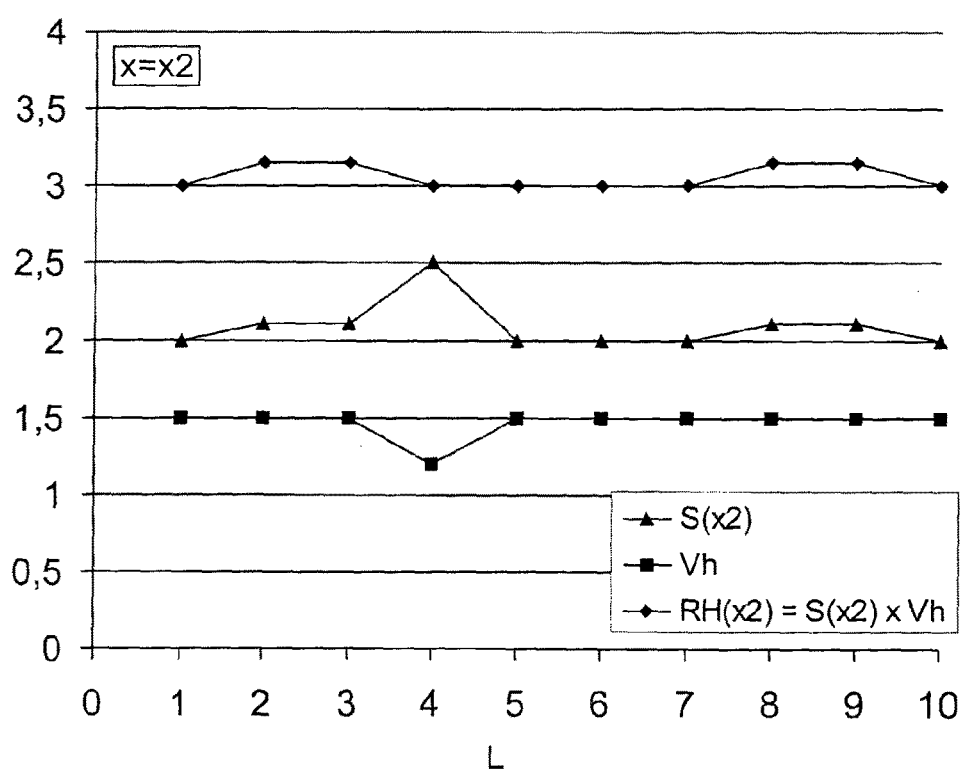

Upon the evaluation of the detected magnetic signals of the value document, the respectively stated calibrating parameter Vw or Vh is employed for each measuring track, in dependence on the position (x, y) on the value document, in order to convert the respectively detected magnetic signal S(x, y) into a resultant magnetic signal RW(x, y) or RH(x, y), cf. FIGS. 3a, 3c. In the present example this is only shown for the two x positions x1, x2 of the value document 2a.

With the value document 2a, the magnetic signals S(x1) of all measuring tracks L1-L10 are for example multiplied by the respective calibrating parameter Vw, yielding the resultant magnetic signal RW(x1), cf. FIG. 3a. And the magnetic signals S(x2) of all measuring tracks L1-L10 are multiplied by the respective calibrating parameter Vh, yielding the resultant magnetic signal RH(x2), cf. FIG. 3c. FIG. 3b represents, for the position x1 of the value document 2a, the detected magnetic signal S(x1) of the soft-magnetic magnetic region W located there as well as the calibrating parameter Vw to be respectively employed at x1, and the resultant magnetic signal RW(x1) of the soft-magnetic magnetic region W for the individual measuring tracks L1-L10. FIG. 3d represents, for the position x2 of the value document, the detected magnetic signal S(x2) of the hard-magnetic magnetic region H located there as well as the calibrating parameter Vh to be respectively employed at x2, and the resultant magnetic signal RH(x2) of the hard-magnetic magnetic region H for the individual measuring tracks L1-L10. A comparison of the resultant magnetic signals RW(x1) with S(x1) and RH(x2) with S(x2) shows that the measurement deviations coming about through the magnetic sensor 10 and potentially falsifying the detected magnetic signal S(x1) and S(x2) are corrected using the calibrating parameters Vw and Vh.

The invention claimed is:

1. A magnetic sensor for checking value documents which are transported, for checking, past the magnetic sensor along a transport direction, wherein the magnetic sensor has at least one first calibrating parameter and at least one second calibrating parameter independent of the at least one first calibrating parameter, wherein:
    the at least one first calibrating parameter is provided for correcting a magnetic signal of the magnetic sensor which the magnetic sensor, upon the check of a value document, detects from a soft-magnetic magnetic region of the value document to be checked; and
    the at least one second calibrating parameter is provided for correcting a magnetic signal of the magnetic sensor which the magnetic sensor, upon the check of a value document, detects from a hard-magnetic magnetic region of the value document to be checked; and
wherein the magnetic sensor is arranged for correcting a magnetic signal of the magnetic sensor that the latter detects from a value document to be checked, either with one of the at least one first calibrating parameters or with one of the at least one second calibrating parameters.

2. The magnetic sensor according to claim 1, wherein the magnetic sensor is arranged for correcting the detected magnetic signal of a value document in dependence on a position on the value document at which the magnetic sensor detects the magnetic signal, and/or in dependence on a value-document type of the value document to be checked, electively with the first calibrating parameter or with the second calibrating parameter.

3. The magnetic sensor according to claim 1, wherein the magnetic sensor is connected to a data memory or has a data memory in which the at least one first calibrating parameter and the at least one second calibrating parameter of the magnetic sensor are deposited, wherein the data memory contains information which determines which of the magnetic signals that the magnetic sensor detects from a value document are to be corrected with the first calibrating parameter and which of the magnetic signals that the magnetic sensor detects from a value document are to be corrected with the second calibrating parameter.

4. The magnetic sensor according to claim 1, wherein the magnetic sensor has a plurality of measuring tracks through which the magnetic sensor can detect a magnetic signal at a plurality of positions transverse to the transport direction of the value document, and that the magnetic sensor respectively has per measuring track both a first calibrating parameter and a second calibrating parameter which is independent of the first calibrating parameter of the respective measuring track.

5. The magnetic sensor according to claim 1, wherein the magnetic sensor has a configurable electronic amplifier for amplifying the detected magnetic signals, which is designed for setting, upon the check of a value document, the amount of amplification of a magnetic signal either on the basis of the first calibrating parameter or on the basis of the second calibrating parameter in dependence on whether said signal is detected from a soft-magnetic magnetic region of a value document or from a hard-magnetic magnetic region of a value document.

6. The magnetic sensor according to claim 1, wherein the magnetic sensor has at least one configurable magnetosensitive element whose sensitivity is configurable and that, upon the check of a value document, the sensitivity of the at least one magnetosensitive element is set either on the basis of the first or on the basis of the second calibrating parameter in dependence on whether the magnetic signal is detected from a soft-magnetic magnetic region of a value document or from a hard-magnetic magnetic region of a value document.

7. The magnetic sensor according to claim 1, wherein the magnetic sensor has a calibrating mode in which the magnetic sensor can detect at least one first and at least one second calibration measurement value of a calibration medium and further process the detected calibration measurement values, wherein the magnetic sensor performs a calibrating method wherein the magnetic sensor detects at least one first calibration measurement value which is provided for correcting the magnetic signal of a soft-magnetic magnetic region and/or detects at least one second calibration measurement value which is provided for correcting the magnetic signal of a hard-magnetic magnetic region, and wherein the detected first and/or second calibration measurement value are further processed in order to test the function of the magnetic sensor using the detected first and/or second calibration measurement value.

8. The magnetic sensor according to claim 1, for checking a value document having at least one soft-magnetic magnetic region and/or at least one hard-magnetic magnetic region,
    the value document being transported past the magnetic sensor along the transport direction, with the magnetic sensor configured to detect magnetic signals from the soft-magnetic magnetic region of the value document and/or with the magnetic sensor configured to detect magnetic signals from the hard-magnetic magnetic region of the value document, and
    the magnetic sensor configured to correct the magnetic signals detected from the soft-magnetic magnetic region using the first calibrating parameter, in order to compensate the magnetic sensor's measurement deviations exhibited by the magnetic signals that the magnetic sensor detects from the soft-magnetic magnetic region of the value document, and/or the magnetic sensor configured to correct the magnetic signals detected from the hard-magnetic magnetic region using the second calibrating parameter, in order to compensate the magnetic sensor's measurement deviations exhibited by the magnetic signals that the magnetic sensor detects from the hard-magnetic magnetic region of the value document, and
    the magnetic sensor configured to employ the magnetic signal of the soft-magnetic magnetic region corrected using the first calibrating parameter, and/or the magnetic signal of the hard-magnetic magnetic region corrected with the second calibrating parameter, for checking the value document.

9. An apparatus for processing value documents which has a magnetic sensor for checking value documents which are transported, for checking, past the magnetic sensor along a transport direction, wherein the magnetic sensor has at least one first calibrating parameter and at least one second calibrating parameter independent of the at least one first calibrating parameter, wherein:
- the at least one first calibrating parameter is provided for correcting a magnetic signal of the magnetic sensor which the magnetic sensor, upon the check of a value document, detects from a soft-magnetic magnetic region of the value document to be checked; and
- the at least one second calibrating parameter is provided for correcting a magnetic signal of the magnetic sensor which the magnetic sensor, upon the check of a value document, detects from a hard-magnetic magnetic region of the value document to be checked; and
- wherein the magnetic sensor is arranged for correcting a magnetic signal of the magnetic sensor that the latter detects from a value document to be checked, either with one of the at least one first calibrating parameters or with one of the at least one second calibrating parameters.

10. A method for calibrating a magnetic sensor for checking value documents which are transported, for checking, past the magnetic sensor along a transport direction, wherein the magnetic sensor has at least one first calibrating parameter and at least one second calibrating parameter independent of the at least one first calibrating parameter, wherein:
- the at least one first calibrating parameter is provided for correcting a magnetic signal of the magnetic sensor which the magnetic sensor, upon the check of a value document, detects from a soft-magnetic magnetic region of the value document to be checked; and
- the at least one second calibrating parameter is provided for correcting a magnetic signal of the magnetic sensor which the magnetic sensor, upon the check of a value document, detects from a hard-magnetic magnetic region of the value document to be checked; and wherein the magnetic sensor is arranged for correcting a magnetic signal of the magnetic sensor that the latter detects from a value document to be checked, either with one of the at least one first calibrating parameters or with one of the at least one second calibrating parameters;

wherein according to the method, the magnetic sensor detects at least one first calibration measurement value which is provided for correcting the magnetic signal of the soft-magnetic magnetic region and/or detects at least one second calibration measurement value which is provided for correcting the magnetic signal of the hard-magnetic magnetic region, and wherein the detected first and/or second calibration measurement value are further processed in order to test the function of the magnetic sensor using the detected first and/or second calibration measurement value.

11. The method for calibrating the magnetic sensor according to claim 10, wherein the first calibration measurement value is detected from a soft-magnetic magnetic region which is present in/on a calibration medium which, for calibrating the magnetic sensor, is transported past the magnetic sensor along a transport direction, and/or that the second calibration measurement value is detected from a hard-magnetic magnetic region which is present in/on a calibration medium which, for calibrating the magnetic sensor, is transported past the magnetic sensor along a transport direction.

12. The method according to claim 10, wherein after the testing of the function of the magnetic sensor there is carried out an adjustment of the magnetic sensor upon which the first calibrating parameter is established using the detected first calibration measurement value and/or the second calibrating parameter is established using the detected second calibration measurement value.

13. The method according to claim 10, wherein upon the testing of the function of the magnetic sensor it is tested whether the detected first calibration measurement value lies within an acceptance range around a first target value and/or whether the detected second calibration measurement value lies within an acceptance range around a second target value, and an adjustment of the magnetic sensor is in particular only carried out if the detected first and/or second calibration measurement value lies outside the respective acceptance range around the respective target value.

14. The method according to claim 10, wherein, after the test of the function of the magnetic sensor an adjustment of the magnetic sensor is optionally carried out if an operating person to whom the result of the test is communicated triggers the adjustment.

15. The method according to claim 10, wherein the first calibrating parameter remains unchanged if the test of the function of the magnetic sensor yields that the detected first calibration measurement value lies within the acceptance range, and if the test yields that the detected first calibration measurement value lies outside the acceptance range the first calibrating parameter is newly established on the basis of the detected first calibration measurement value and the previous first calibrating parameter is replaced by the newly established one, and/or the second calibrating parameter remains unchanged if the test of the function of the magnetic sensor yields that the detected second calibration measurement value lies within the acceptance range, and if the test yields that the detected second calibration measurement value lies outside the acceptance range the second calibrating parameter is newly established using the detected second calibration measurement value and the previous second calibrating parameter is replaced by the newly established one.

* * * * *